US012626767B2

(12) United States Patent
Deng et al.

(10) Patent No.: US 12,626,767 B2
(45) Date of Patent: May 12, 2026

(54) MEMORY DEVICES, CONTROL METHODS OF MEMORY, AND MEMORY SYSTEMS

(71) Applicant: Yangtze Memory Technologies Co., Ltd., Wuhan (CN)

(72) Inventors: Jialiang Deng, Wuhan (CN); Yahai Liu, Wuhan (CN); Yuankang Yang, Wuhan (CN)

(73) Assignee: Yangzte Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 18/823,666

(22) Filed: Sep. 3, 2024

(65) Prior Publication Data

US 2025/0364053 A1 Nov. 27, 2025

(30) Foreign Application Priority Data

May 24, 2024 (CN) .......................... 202410658907.0

(51) Int. Cl.
*G11C 16/16* (2006.01)
*G06F 3/06* (2006.01)
*G11C 16/04* (2006.01)
*G11C 16/34* (2006.01)

(52) U.S. Cl.
CPC ............ *G11C 16/16* (2013.01); *G06F 3/0604* (2013.01); *G06F 3/0652* (2013.01); *G06F 3/0679* (2013.01); *G11C 16/0483* (2013.01); *G11C 16/349* (2013.01)

(58) Field of Classification Search
CPC ... G11C 16/16; G11C 16/0483; G11C 16/349; G06F 3/0604; G06F 3/0652; G06F 3/0679
See application file for complete search history.

(56) References Cited

U.S. PATENT DOCUMENTS

| | | | | |
|---|---|---|---|---|
| 9,934,858 | B2 * | 4/2018 | Yang .................... | G11C 11/5628 |
| 2010/0202237 | A1 * | 8/2010 | Moshayedi ............ | G11C 5/141 |
| | | | | 365/228 |
| 2011/0173378 | A1 * | 7/2011 | Filor .................... | G11C 29/765 |
| | | | | 711/E12.008 |
| 2012/0213005 | A1 * | 8/2012 | Lee ...................... | G11C 16/349 |
| | | | | 365/185.11 |
| 2022/0365707 | A1 * | 11/2022 | Kachare ................ | G06F 3/0655 |

* cited by examiner

*Primary Examiner* — Arpan P. Savla
*Assistant Examiner* — Jason Michael Pinga
(74) *Attorney, Agent, or Firm* — Hanley, Flight & Zimmerman, LLC

(57) ABSTRACT

The present application discloses a memory device, a control method of a memory device, and a memory system, and belongs to the technical field of memory device. The control method includes: a peripheral circuit receiving an erase instruction, and recording a number of the received erase instructions, wherein the erase instruction is to instruct the peripheral circuit to erase one memory block in a memory cell array; and the peripheral circuit, in response to the number of the received erase instructions reaching a number threshold, selecting one memory page in a first memory block of the memory cell array to perform program processing.

20 Claims, 12 Drawing Sheets

N (N*X=MAX, MAX is a rated number of program/erase cycles of a second memory block)

100

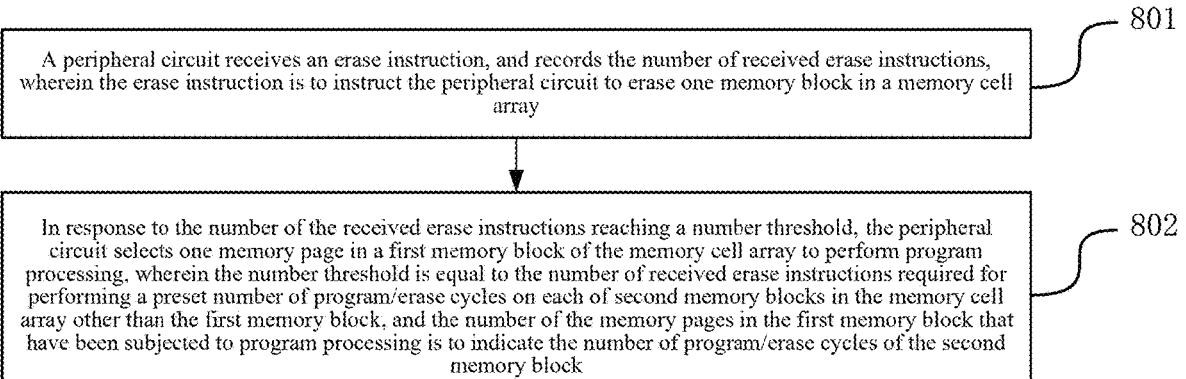

A peripheral circuit receives an erase instruction, and records the number of received erase instructions, wherein the erase instruction is to instruct the peripheral circuit to erase one memory block in a memory cell array

801

In response to the number of the received erase instructions reaching a number threshold, the peripheral circuit selects one memory page in a first memory block of the memory cell array to perform program processing, wherein the number threshold is equal to the number of received erase instructions required for performing a preset number of program/erase cycles on each of second memory blocks in the memory cell array other than the first memory block, and the number of the memory pages in the first memory block that have been subjected to program processing is to indicate the number of program/erase cycles of the second memory block

(N*X=MAX, MAX is a rated number of program/erase cycles of a second memory block)

MEMORY DEVICES, CONTROL METHODS OF MEMORY, AND MEMORY SYSTEMS

CROSS-REFERENCE TO RELATED APPLICATIONS

This application claims priority to and the benefit of Chinese Patent Application 202410658907.0, filed on May 24, 2024, which is hereby incorporated by reference in its entirety.

TECHNICAL FIELD

The present application relates to the technical field of memory devices, and particularly to memory devices, control methods of memory devices, and memory systems.

BACKGROUND

A memory device comprises three basic operations of erase, write, and read. Generally, before data is written to a memory block in the memory device, data that has been stored in the memory block needs to be erased first, wherein the number of times the memory block is first erased and then written with data may be referred to as the number of program/erase cycles program/erase (PE) cycles.

BRIEF DESCRIPTION OF THE DRAWINGS

The drawings to be used in description of examples will be briefly introduced below in order to illustrate the technical solutions in the examples of the present application more clearly. Apparently, the drawings described below are only some examples of the present application. Those of ordinary skill in the art may obtain other drawings according to these drawings without inventive effort.

FIG. 8 is a flow diagram of a memory control method provided by examples of the present application;

DETAILED DESCRIPTION

In order to clarity the objectives, technical solutions, and advantages of the present application, the implementations of the present application will be described in detail below with reference to the drawings.

The number of program/erase cycles of the memory block is an important parameter for indicating a health degree of the memory device. As the number of the memory devices managed by a memory controller increases, the pressure of the memory controller to maintain the number of program/erase cycles is also increasing.

Figure 1:
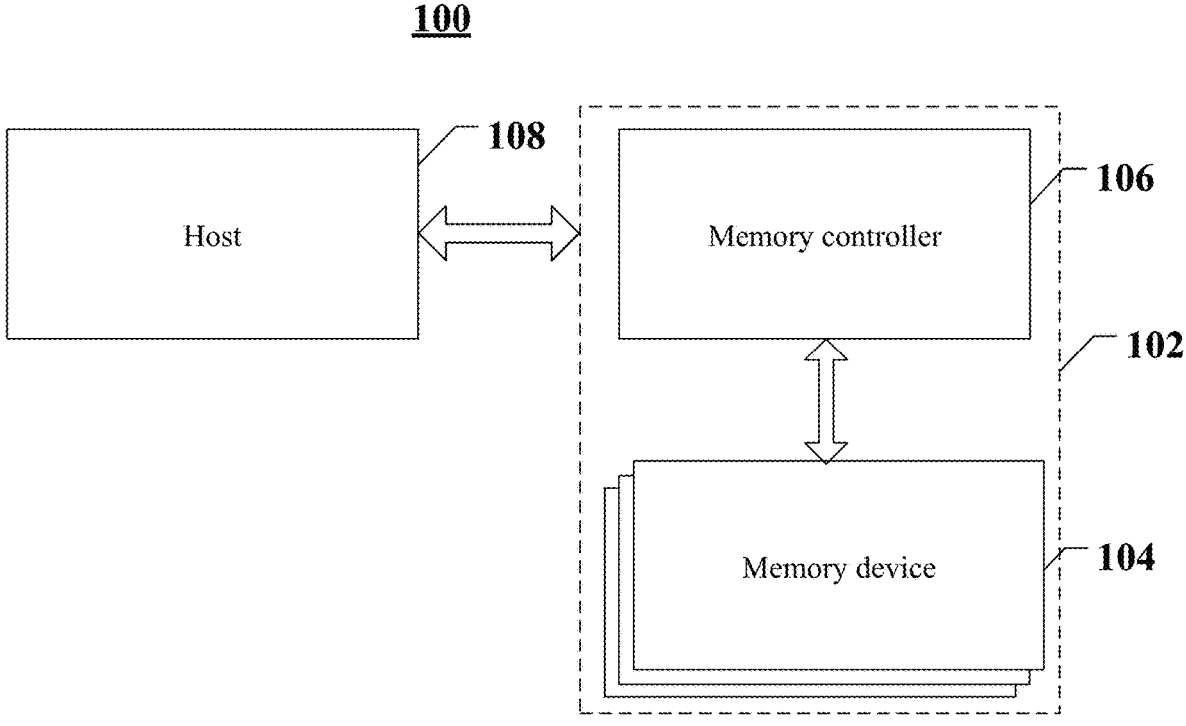
FIG. 1 is a schematic diagram of an example system having a memory device provided by examples of the present application.

FIG. 1 shows a block diagram of an example system 100 having a memory system according to some aspects of the present application. The system 100 may comprise a mobile phone, a desktop computer, a laptop computer, a tablet computer, a vehicle computer, a gaming console, a printer, a positioning apparatus, a wearable electronic apparatus, a smart sensor, a virtual reality (VR) apparatus, an augmented reality (AR) apparatus, or any other suitable electronic apparatus having a memory device. As shown in FIG. 1, the system 100 may comprise a host 108 and a memory system 102, and the memory system 102 is provided with one or more memory devices 104 and a memory controller 106. The host 108 may be a processor (e.g., a central processing unit (CPU)) or a system-on-chip (SoC) (e.g., application processor (AP)) of an electronic apparatus. The host 108 may be configured to send or receive data to or from the memory device 104.

The memory device 104 may comprise any memory device disclosed in the present application. In an example, the memory device 104 comprises a NAND flash memory, such as a three-dimensional (3D) NAND flash memory.

In some implementations, the memory controller 106 is coupled to the memory device 104 and the host 108, and is configured to control the memory device 104. The memory controller 106 may manage data stored in the memory device 104, and communicate with the host 108. In some implementations, the memory controller 106 is designed for operating in a low duty-cycle environment, such as secure digital (SD) cards, compact flash (CF) cards, universal serial bus (USB) flash drives, or other medium for use in electronic apparatuses, such as personal computers, digital cameras, mobile phones, etc. In some implementations, the memory controller 106 is designed for operating in a high duty-cycle environment of SSDs or embedded multi media cards (eMMCs) used as data memories for mobile apparatuses, such as smartphones, tablets, laptop computers, etc., and enterprise memory arrays. The memory controller 106 may further be configured to control operations of the memory device 104, such as reading, erasing, and program processing. The memory controller 106 may further be configured to manage various functions with respect to data stored or to be stored in the memory device 104, including, but not limited to, bad-block management, garbage collection, logical-to-physical address translation, wear leveling, etc. In some implementations, the memory controller 106 is further configured to process error correction codes (ECCs) with respect to data read from or written to the memory device 104. The memory controller 106 may further perform any other suitable functions, for example, formatting the memory device 104. The memory controller 106 may communicate with an external apparatus (e.g., the host 108) according to a specific communication protocol. For example, the memory controller 106 may communicate with the external apparatus through at least one of various interface protocols, such as a USB protocol, an MMC protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, a Firewire protocol, etc.

Figure 2:
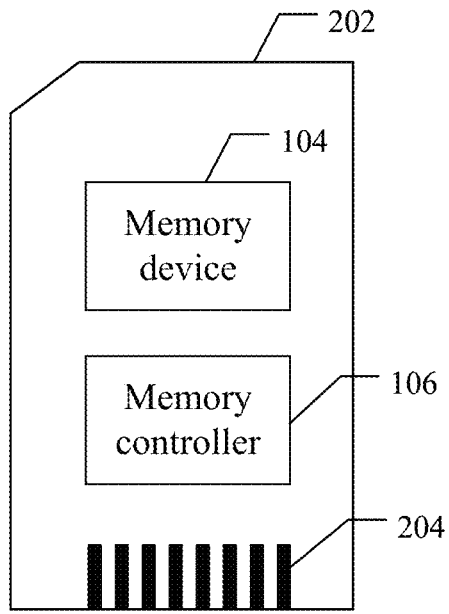
FIG. 2 is a schematic diagram of an example memory card having a memory device provided by examples of the present application.
Figure 3:
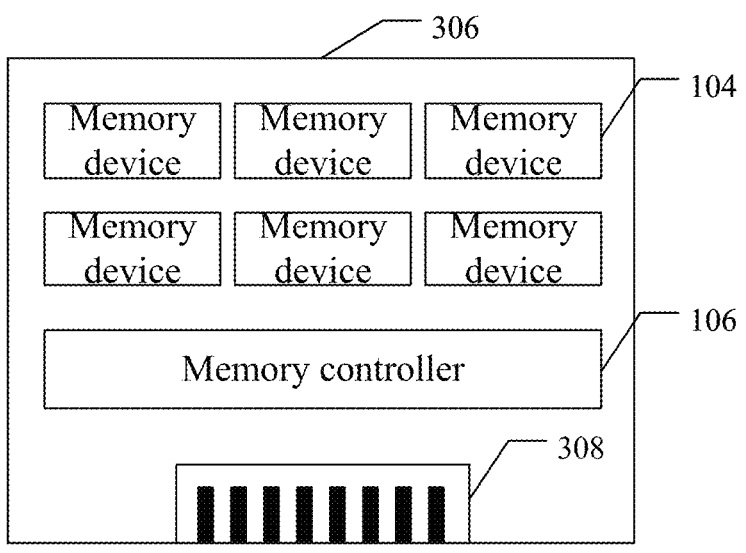
FIG. 3 is a schematic diagram of an example solid-state drive having a memory device provided by examples of the present application.

The memory controller 106 and the one or more memory devices 104 may be integrated into various types of storage apparatuses, for example, be included in the same package (such as a universal flash storage (UFS) package or an eMMC package). That is to say, the memory system 102 may be implemented and packaged into different types of end electronic products. In one example shown in FIG. 2, the memory controller 106 and the single memory device 104 may be integrated into a memory card 202. The memory card 202 may comprise a personal computer memory card international association (PCMCIA) PC card, a CF card, a smart media (SM) card, a memory stick, a multimedia card (MMC, RS-MMC, MMCmicro), an SD card (SD, miniSD, microSD, SDHC), a UFS, etc. The memory card 202 may further comprise a memory card connector 204 coupling the memory card 202 with a host (e.g., the host 108 in FIG. 1). In another example as shown in FIG. 3, the memory controller 106 and the plurality of memory devices 104 may be integrated into an SSD 306. The SSD 306 may further comprise an SSD connector 308 coupling the SSD 306 with the host (e.g., the host 108 in FIG. 1). In some implementations, at least one of a storage capacity or an operation speed of the SSD 306 is greater than at least one of a storage capacity and/or an operation speed of the memory card 202.

Figure 4:
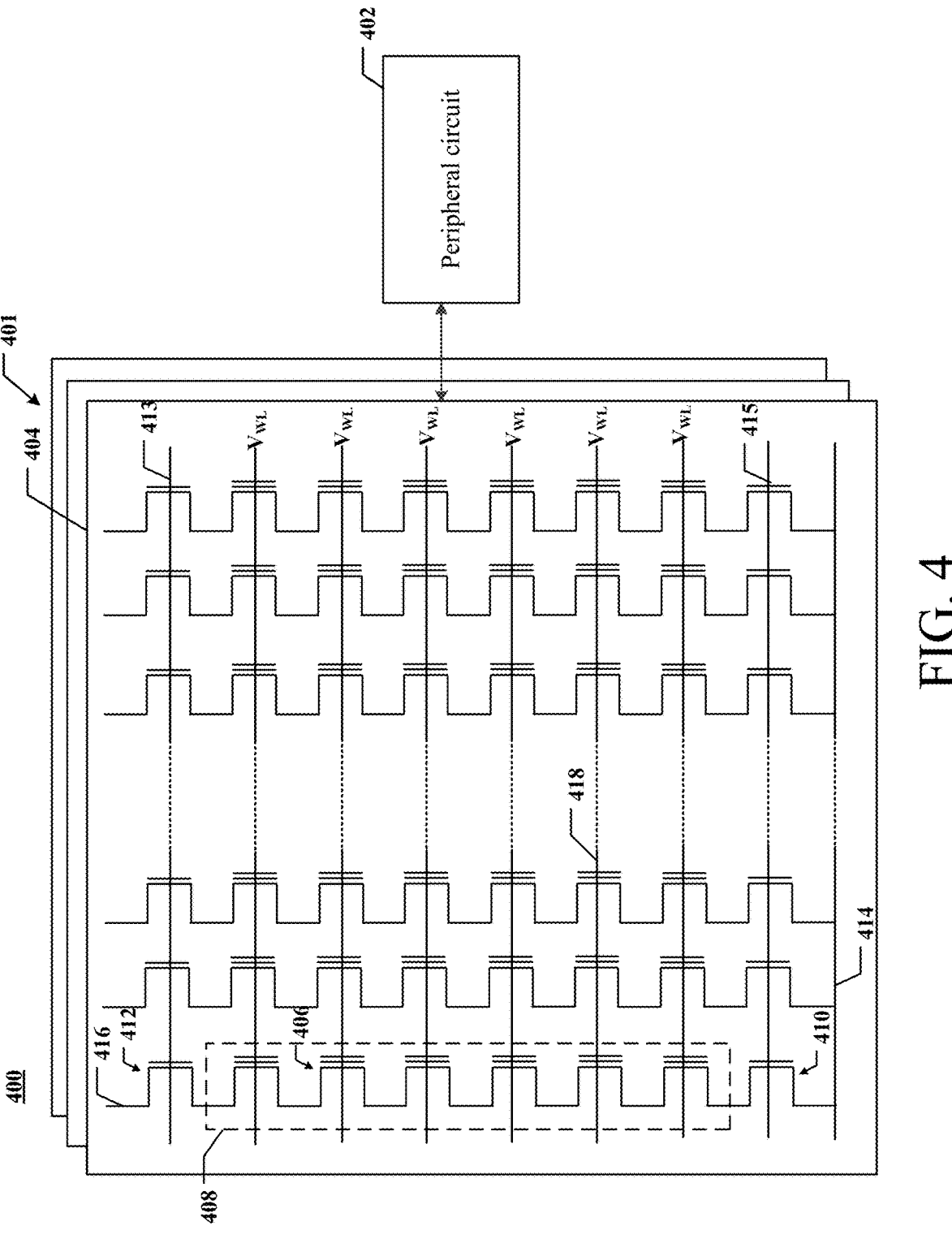
FIG. 4 is a schematic diagram of a memory device comprising a peripheral circuit provided by examples of the present application.

FIG. 4 shows a schematic circuit diagram of an example three-dimensional memory device 400 comprising a peripheral circuit according to some aspects of the present application. The three-dimensional memory device 400 may be an example of the memory device 104 in FIG. 1.

The three-dimensional memory device 400 may comprise a memory cell array 401 and a peripheral circuit 402 coupled to the memory cell array 401. The memory cell array 401 may comprise a NAND flash memory cell array, wherein a memory cell 406 is provided in the form of an array of NAND memory strings 408, and each NAND memory string 408 extends vertically above a substrate (not shown). In some implementations, each NAND memory string 408 comprises the plurality of memory cells 406 coupled in series and stacked vertically. Each memory cell 406 may maintain a continuous analog value, such as voltage or charge, which depends on the number of electrons trapped within a region of the memory cells 406. Each memory cell 406 may be either a floating gate type memory cell comprising a floating gate transistor, or a charge trapping type memory cell comprising a charge trapping transistor.

In some implementations, each memory cell 406 comprises a single-level cell (SLC) that has two possible memory states and thus may store one bit of data. For example, a first memory state "0" may correspond to a first voltage range, and a second memory state "1" may correspond to a second voltage range. In some implementations, each memory cell 406 comprises a multi-level cell (MLC) that can store more than one bit of data in four or more than four memory states. For example, the MLC may store two bits per cell, three bits per cell (also referred to as a trinary-level cell (TLC)), or four bits per cell (also referred to as a quad-level cell (QLC)). Each MLC may be programmed to assume a range of possible nominal storage values. In one example, if each MLC stores two bits of data, the MLC may be programmed from an erased state to one of three possible memory states by writing one of three possible nominal storage values to a cell, and a fourth nominal storage value may be used to represent the erased state.

As shown in FIG. 4, each NAND memory string 408 may comprise a source select gate (SSG) 410 at a source terminal of the memory string and a drain select gate (DSG) 412 at a drain terminal of the memory string. The SSG 410 and the DSG 412 may be configured to activate a selected NAND memory string 408 (a column of an array) during reading and program processing. In some implementations, sources of the NAND memory strings 408 in a same memory block 404 are coupled through a same source line (SL) 414 (e.g., a common SL). In other words, according to some implementations, all the NAND memory strings 408 in the same memory block 404 have an array common source (ACS). According to some implementations, the DSG 412 of each NAND memory string 408 is coupled to a respective bit line 416, and data may be read from or written to the bit line 416 via an output bus (not shown). In some implementations, each NAND memory string 408 is configured to be selected or unselected by applying a select voltage (e.g., above a threshold voltage of a transistor having the DSG 412) or an unselect voltage (e.g., 0 V) to the respective DSG 412 via one or more DSG lines 413 and/or by applying a select voltage (e.g., above a threshold voltage of a transistor having the SSG 410) or an unselect voltage (e.g., 0 V) to the respective SSG 410 via one or more SSG lines 415.

As shown in FIG. 4, the memory cell array 401 may comprise the plurality of memory blocks 404, each memory block 404 comprises the plurality of NAND memory strings 408, and each of the plurality of memory blocks 404 may have a common source line 414 (e.g., coupled to the ground). In some implementations, each memory block 404 is a basic data unit for an erase operation, i.e., all of the memory cells 406 on the same memory block 404 are erased at the same time. In order to erase the memory cells 406 in a selected memory block 404a, the source line 414 coupled to the selected memory block 404a as well as an unselected memory block 404b that is in the same plane as the selected memory block 404a may be biased with an erase voltage (Vers, such as a high positive voltage (e.g., 20 V or higher)). It is to be understood that, in some examples, the erase operation may be executed at a half block level, a quarter block level, or a level having any suitable number of blocks or any suitable fractions of a block. The memory cells 406 of adjacent ones of the NAND memory strings 408 may be coupled through a word line 418 that selects which row of memory cells 406 is affected by the reading and program processing. In some implementations, each word line 418 is coupled to the plurality of memory cells 406.

Figure 5:
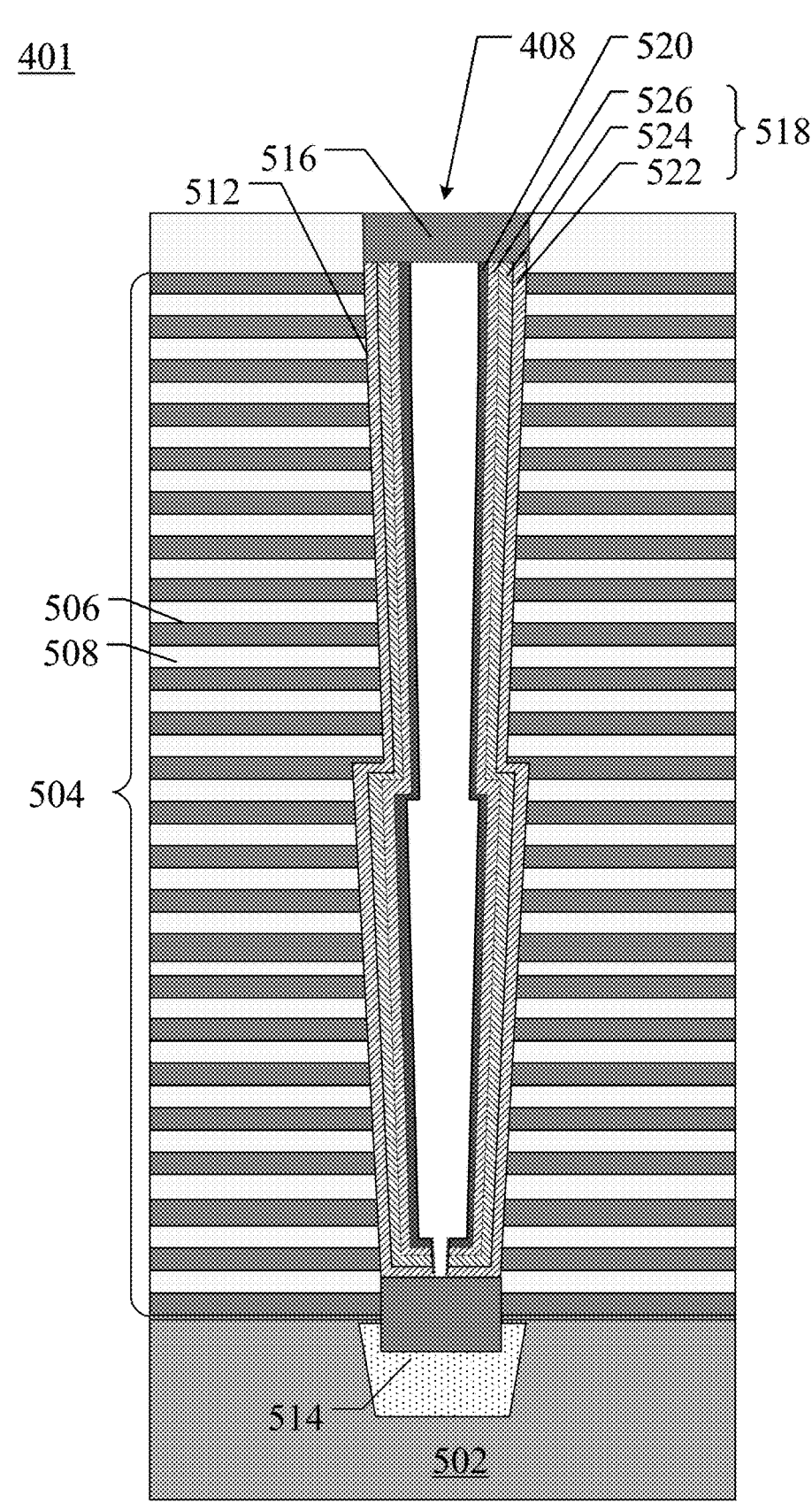
FIG. 5 is a schematic diagram of an example memory cell array comprising a NAND memory string provided by examples of the present application.

FIG. 5 shows a cross-sectional view of an example memory cell array 401 comprising a NAND memory string 408 according to some aspects of the present application. As shown in FIG. 5, the NAND memory string 408 may extend through a memory stack 504 vertically above a substrate 502. The substrate 502 may comprise silicon (e.g., single crystalline silicon), silicon germanium (SiGe), gallium arsenide (GaAs), germanium (Ge), silicon on insulator (SOI), germanium on insulator (GOI), or any other suitable materials.

The memory stack 504 may comprise a gate conductive layer 506 and a dielectric layer 508, which are alternate with each other. The number of pairs of the gate conductive layers 506 and the dielectric layers 508 in the memory stack 504 may determine the number of the memory cells 406 in the memory cell array 401. The gate conductive layer 506 may comprise a conductive material. The conductive material includes, but is not limited to, tungsten (W), cobalt (Co), copper (Cu), aluminum (Al), polysilicon, doped silicon, silicide, or any combination thereof. In some implementations, each gate conductive layer 506 comprises a metal layer, e.g., a tungsten layer. In some implementations, each gate conductive layer 506 comprises a doped polysilicon layer. Each gate conductive layer 506 may comprise a control gate surrounding the memory cell 406, and may laterally extend at the top of the memory stack 504 as a DSG line 413, laterally extend at the bottom of the memory stack 504 as an SSG line 415, or laterally extend between the DSG line 413 and the SSG line 415 as the word line 418.

As shown in FIG. 5, the NAND memory string 408 may extend vertically through a channel structure 512 of the memory stack 504. In some implementations, the channel structure 512 comprises channel holes filled with (one or more types of) semiconductor materials (e.g., as semiconductor channels 520) and (one or more types of) dielectric materials (e.g., as memory film 518). In some implementations, the semiconductor channel 520 comprises silicon, e.g., polysilicon. In some implementations, the memory film 518 is a composite dielectric layer comprising a tunneling layer 526, a storage layer 524 (also referred to as a "charge trapping/storage layer"), and a blocking layer 522. The channel structure 512 may have a cylindrical shape (e.g., a pillar shape). According to some implementations, the semiconductor channel 520, the tunneling layer 526, the storage layer 524, and the blocking layer 522 are arranged radially from the center toward the outer surface of the pillar in this order. The tunneling layer 526 may comprise silicon oxide, silicon oxynitride, or any combination thereof. The storage layer 524 may comprise silicon nitride, silicon oxynitride, or any combination thereof. The blocking layer 522 may comprise silicon oxide, silicon oxynitride, a high dielectric constant (high-k) dielectric, or any combination thereof. In one example, the memory film 518 may comprise a composite layer of silicon oxide/silicon oxynitride/silicon oxide (ONO).

According to some implementations, as shown in FIG. 5, a well 514 (e.g., a P well and/or an N well) is formed in the substrate 502, and the source terminal of the NAND memory string 408 is in contact with the well 514. For example, the source line 414 may be coupled to the well 514, so as to apply the erase voltage to the well 514 (i.e., a source of the NAND memory string 408) during an erase operation. In some implementations, the NAND memory string 408 further comprises a channel plug 516 at the drain terminal of the NAND memory string 408. It is to be understood that, although not shown in FIG. 5, additional components forming the memory cell array 401 may be formed, and the additional components include, but are not limited to, gate line slits/source contacts, local contacts, interconnect layers, etc.

Figure 6:
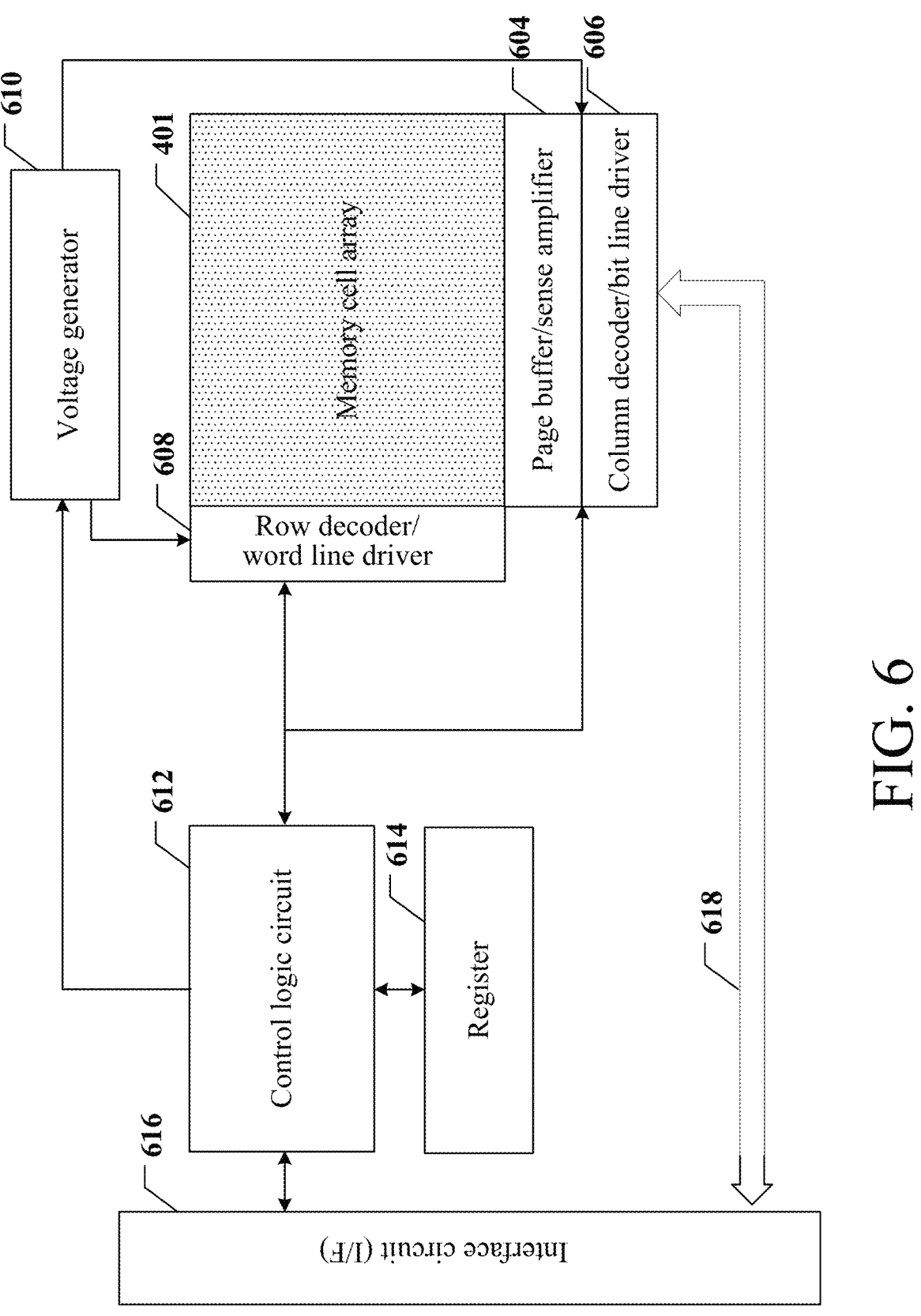
FIG. 6 is a schematic diagram of a memory device comprising a memory cell array and a peripheral circuit provided by examples of the present application.

Referring back to FIG. 4, the peripheral circuit 402 may be coupled to the memory cell array 401 through the bit line 416, the word line 418, the source line 414, the SSG line 415, and the DSG line 413. The peripheral circuit 402 may comprise any suitable analog, digital, and hybrid signal circuits for promoting operations of the memory cell array 401 by applying and sensing voltage signals and/or current signals to and from each target memory cell 406 via the bit line 416, the word line 418, the source line 414, the SSG line 415, and the DSG line 413. The peripheral circuit 402 may comprise various types of peripheral circuits formed using a metal-oxide-semiconductor (MOS) technology. For example, FIG. 6 shows some example peripheral circuits. The peripheral circuit 402 comprises a page buffer/sense amplifier 604, a column decoder/bit line driver 606, a row decoder/word line driver 608, a voltage generator 610, a control logic circuit 612, a register 614, an interface circuit 616, and a data bus 618. It is to be understood that, in some examples, additional peripheral circuits not shown in FIG. 6 may also be included.

The page buffer/sense amplifier 604 may be configured to read from and program (write) data to the memory cell array 401 according to a control signal from the control logic circuit 612. In another example, the page buffer/sense amplifier 604 may perform a program verification operation to ensure that the data has been properly programmed into the memory cell 406 coupled to the selected word line 418. In yet another example, the page buffer/sense amplifier 604 may also sense a low power signal from the bit line 416 that represents a data bit stored in the memory cell 406, and amplifies a small voltage swing to a recognizable logic level in the read operation. The column decoder/bit line driver 606 may be configured to be controlled by the control logic circuit 612, and select one or more NAND memory strings 408 by applying a bit line voltage generated from the voltage generator 610.

The row decoder/word line driver 608 may be configured to be controlled by the control logic circuit 612, select/unselect the memory blocks 404 of the memory cell array 401, and select/unselect the word lines 418 of the memory blocks 404. The row decoder/word line driver 608 may further be configured to drive the word lines 418 using a word line voltage generated from the voltage generator 610. In some implementations, the row decoder/word line driver 608 may also select/unselect and drive the SSG line 415 and the DSG line 413. As described below in detail, the row decoder/word line driver 608 is configured to execute an erase operation on the memory cells 406 coupled to (one or more) selected word lines 418. The voltage generator 610 may be configured to be controlled by the control logic circuit 612, and generate the word line voltage (such as, a read voltage, a program voltage, a pass voltage, a local voltage, a verify voltage, etc.), the bit line voltage, and a source line voltage, which are to be supplied to the memory cell array 401.

The control logic circuit 612 may be coupled to each peripheral circuit 402 described above and configured to control operations of each peripheral circuit 402. The register 614 may be coupled to the control logic circuit 612 and comprise a state register, a command register, and an address register for storing state information, a command operation code (OP code), and a command address for controlling the operation of each peripheral circuit 402. The interface circuit 616 may be coupled to the control logic circuit 612, and act as a control buffer to buffer and relay the control command received from a host (not shown) to the control logic circuit 612, and buffer and relay the state information received from the control logic circuit 612 to the host. The interface circuit 616 may also be coupled to the column decoder/bit line driver 606 via the data bus 618 and act as a data I/O interface and a data buffer to buffer and relay the data to the memory cell array 401, or buffer or relay the data from the memory cell array 401.

Figure 7:
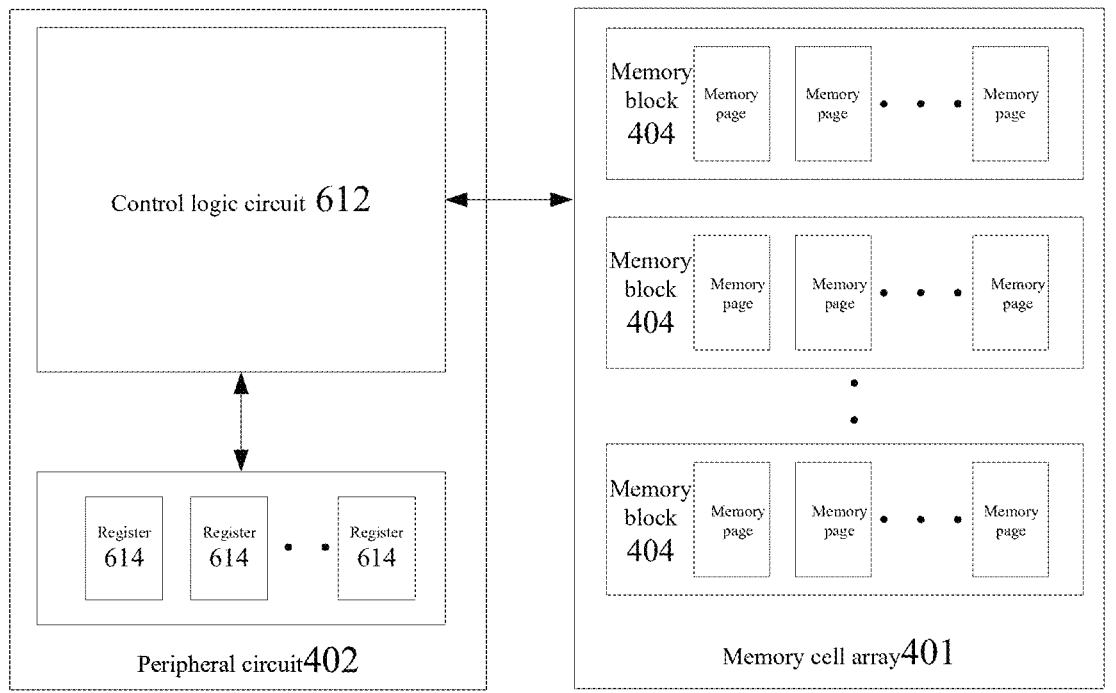
FIG. 7 is a schematic diagram of a memory device comprising a memory cell array and a peripheral circuit provided by examples of the present application.

FIG. 7 is a schematic diagram of an example memory device comprising a memory cell array and a peripheral circuit provided by the present application. As shown in FIG. 7, the peripheral circuit 402 may comprise a plurality of registers 614. The control logic circuit 612 may store or read some parameters involved in the examples of the present application to the plurality of registers 614, for example, the number of times an erase instruction is received. The memory cell array 401 comprises a plurality of memory blocks 404, and each memory block comprises a plurality of memory pages. The plurality of memory blocks 404 may be configured with redundant memory blocks configured to store information related to parameters of the memory device. In the examples of the present application, the number of program/erase cycles of other memory blocks may be indicated by the number of the memory pages in the redundant memory block that are subjected to program processing.

FIG. 8 is a flow diagram of a memory control method provided by examples of the present application. The control method may be applied to the memory device as shown by the above-mentioned examples, and performed by a peripheral circuit included in the memory device. Referring to FIG. 8, the control method comprises:

operation 801, a peripheral circuit receiving an erase instruction, and recording a number of the received erase instructions, wherein the erase instruction is to instruct the peripheral circuit to erase one memory block in a memory cell array.

When writing data to a memory block, the memory block needs to be erased first and then written, therefore after an erase instruction is issued for one memory block, data will then be written to the memory block. Therefore, in the examples of the present application, the number of program/erase cycles of the memory block may be counted by counting the number of the received erase instructions.

In some implementations, a control logic circuit included in the peripheral circuit may receive erase instructions sent by a memory controller and carrying memory block addresses. Each time after receiving an erase instruction, the control logic circuit may increment the recorded number of the received erase instructions by 1. In one example, the number of the received erase instructions recorded by the control logic circuit may be stored in a register included in the peripheral circuit. After the memory device is powered on, the number of the received erase instructions stored in the register recording the received erase instructions may be initialized to 0, and each time after receiving an erase instruction, the control logic circuit may control the number of the received erase instructions stored in the register to be incremented by 1.

Operation 802: in response to the number of the erase received instructions reaching a number threshold, the peripheral circuit selects one memory page in a first memory block of the memory cell array to perform program processing. The number threshold is equal to the total number of received erase instructions required for performing a preset number of program/erase cycles on each of second memory blocks in the memory cell array other than the first memory block, and the number of the memory pages in the first memory block that have been subjected to program processing is to indicate the number of program/erase cycles of the second memory block.

The first memory block may be a redundant memory block that is configured in the memory device and may be configured to store information related to parameters of the memory device. The second memory block may be a memory block in the memory device externally providing a storage capability, for example, a memory block configured to store service data on a host.

The memory controller sets an erase equilibrium strategy for each memory device, and the number of program/erase cycles of each second memory block in the memory device may be close to each other by employing the erase equilibrium strategy. For example, in the erase equilibrium strategy, according to a sequence of the second memory blocks, program/erase cycles may be performed on each of the second memory blocks in the memory device sequentially, and after n program/erase cycles are performed on the last one of various second memory blocks, $(n+1)^{th}$ program/erase cycle may be then performed on one of various second memory blocks. In this way, the number of program/erase cycles among various second memory blocks differs by up to 1. That is to say, the number of program/erase cycles corresponding to each of the second memory blocks is basically the same, such that, in the examples of the present application, the number of program/erase cycles may be maintained for the plurality of second memory blocks in the memory device. Therefore, the number of program/erase cycles may be prevented from being recorded for each second memory block in the memory device, thereby reducing a processing pressure for recording the number of program/erase cycles.

In the examples of the present application, instead of directly indicating the number of program/erase cycles of the memory block, the first memory block indicates the number of program/erase cycles of the memory block by the number of the memory pages in the first memory block that have been programmed. One programmed memory page in the first memory block may be configured to indicate the preset number of program/erase cycles of the second memory block, and the preset number of program/erase cycles may be one or more.

In one example, one programmed memory page in the first memory block may be used to indicate that one program/erase cycle has been performed on a second memory block, and thus the number of the memory pages in the first memory block that have been programmed is the number of program/erase cycles of each of the second memory blocks. In another example, one programmed memory page in the first memory block may be used to indicate that a number of program/erase cycles have been performed on a second memory block, and the number of program/erase cycles may be a ratio of a rated number of program/erase cycles corresponding to the second memory block to the number of memory pages in the first memory block. For example, one programmed memory page may be used to indicate that X program/erase cycles have been performed on the memory block, and therefore n memory pages of the first memory block that have been programmed may indicate that the number of program/erase cycles corresponding to each of the second memory blocks in each memory is m, wherein $m=n*X$, and the rated number of program/erase cycles refers to a maximum number of program/erase cycles of the second memory block that is allowed in a normal working state.

Figure 9:
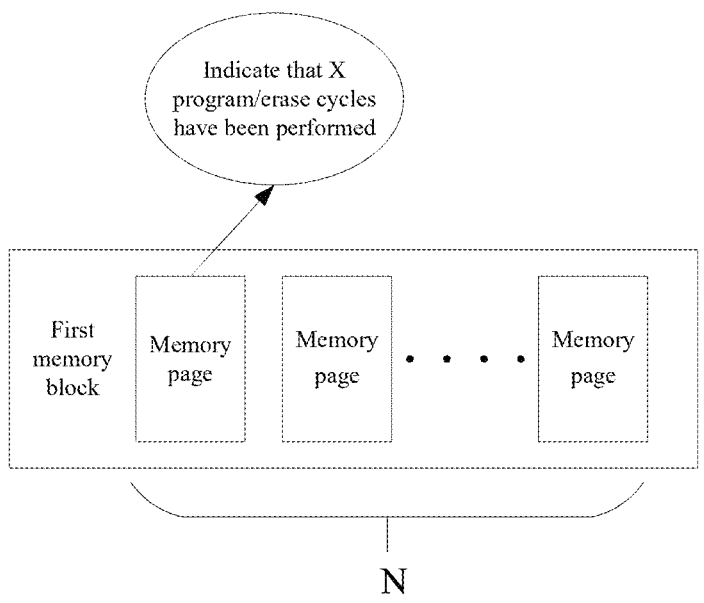
FIG. 9 is a schematic diagram of a method of determining a number of program/erase cycles provided by examples of the present application.

The number threshold may be determined according to the number of the memory pages included in the first memory block and the rated number of program/erase cycles corresponding to the second memory block. The number threshold may comprise the number of received erase instructions required for performing X program/erase cycles on each of the second memory blocks in the memory cell array, wherein X may be any integer greater than or equal to 1. As shown in FIG. 9, the first memory block comprises N memory pages, the rated number of program/erase cycles of the second memory block is MAX, and one programmed memory page in the first memory block may indicate that X program/erase cycles are performed on the second memory block, wherein N*X=MAX. Correspondingly, when the number of program/erase cycles of each of the second memory blocks is indicated by Y first memory blocks, one programmed memory page in the first memory block may indicate that M program/erase cycles are performed on the second memory block, wherein N*Y*M=MAX.

In some implementations, each time after the control logic circuit receives an erase instruction, the recorded number of the erase instructions received by the memory device may be increment by 1, and whether a numerical value recorded in the register reaches the set number threshold is determined. If it is determined that the numerical value stored in the register reaches the number threshold, it indicates that X program/erase cycles are performed on each of the second memory blocks in the memory device, such that the control logic circuit may be controlled to perform program processing on one unprogrammed memory page in the first memory block, so as to indicate that the number of program/erase cycles of the second memory blocks in the memory device is incremented by X. It is to be noted that, performing program processing on the memory page in the first memory block may be to program a memory cell in the memory page from an erased state to any one of programmed states.

Furthermore, in response to the number of the received erase instructions reaching the number threshold, the control logic circuit may reset, to 0, the numerical value recorded in the memory recording the number of the received erase instructions, so as to count the number of program/erase cycles for a next round.

In the examples of the present application, the memory device may indicate, according to the number of the memory pages in the first memory block that are subjected to program processing, the number of program/erase cycles of each of the second memory blocks in the memory device. In this way, in one aspect, the memory device records the number of program/erase cycles of its own memory blocks, such that the memory controller can be prevented from respectively recording the number of program/erase cycles for the plurality of coupled memory devices, thereby reducing a processing pressure of the memory controller. In another aspect, power failure losses of the number of program/erase cycles can be avoided by indicating the number of program/erase cycles according to the number of memory pages that have been subjected to program processing, such that the stability of recording the number of program/erase cycles can be improved.

In one implementation, the control logic circuit may receive, through an interface circuit, an query instruction for the number of program/erase cycles sent by the memory controller. The control logic circuit may determine, in response to the query instruction for the number of program/erase cycles, the number of the memory pages in the first memory block that have been programmed, and then return the number of the memory pages or the number of program/erase cycles indicated by the number of the memory pages to the memory controller.

In some implementations, after receiving the query instruction for the number of program/erase cycles, the control logic circuit may perform a read operation on the memory page in the first memory block to determine the number of the memory pages in the first memory block that have been programmed. In one example, each time when controlling the performing of program processing on the memory page in the first memory block, the control logic circuit may program the memory page according to an address sequence of the memory page in the first memory block. Correspondingly, when the read operation is performed on the first memory block, a dichotomy manner may be employed to perform the read operation on the first memory block. That is to say, a first memory page, of which address sequence is in a middle position, of the first memory block may be read first; if it is determined that a memory state of the first memory page is read as an erased state, a second memory page of which address sequence is in a position between the first one of the memory pages and the first memory page may further be read; and if it is determined that the memory state of the first memory page is read as a programmed state, a third memory page of which address sequence is in a position between the last one of the memory pages and the first memory page may further be read.

Further, if it is determined that a memory state of the second memory page is read as the erased state, a fourth memory page of which address sequence is in a position between the first one of the memory pages and the second memory page may further be read; and if it is determined that the memory state of the second memory page is read as the programmed state, a fifth memory page of which address sequence is in a position between the first memory page and the second memory page may further be read.

If it is determined that a memory state of the third memory page is read as the erased state, a sixth memory page of which address sequence is in a position between the first memory page and the third memory page may further be read; and if it is determined that the memory state of the third memory page is read as the programmed state, a seventh memory page of which address sequence is in a position between the last one of the memory pages and the third memory page may further be read. And so on, by each time reading the memory page in the middle position, until the current memory page in the first memory block that is recently subjected to program processing may be determined, the number of the memory pages in the first memory block that have been programmed may be determined.

In an example, the control logic circuit or the memory controller may store a correspondence relationship between addresses of the memory pages in the first memory block and the number of program/erase cycles. After the current memory page in the first memory block that is recently subjected to program processing is determined, the number of program/erase cycles corresponding to a target address may be determined according to the correspondence relationship according to the target address of the memory page. For example, the control logic circuit may determine, according to the correspondence relationship, the number of program/erase cycles corresponding to the target address, and then return the number of program/erase cycles to the memory controller. Alternatively, the control logic circuit sends the target address to the memory controller, and the memory controller determines, according to the correspondence relationship, the number of program/erase cycles corresponding to the target address.

Figure 10:
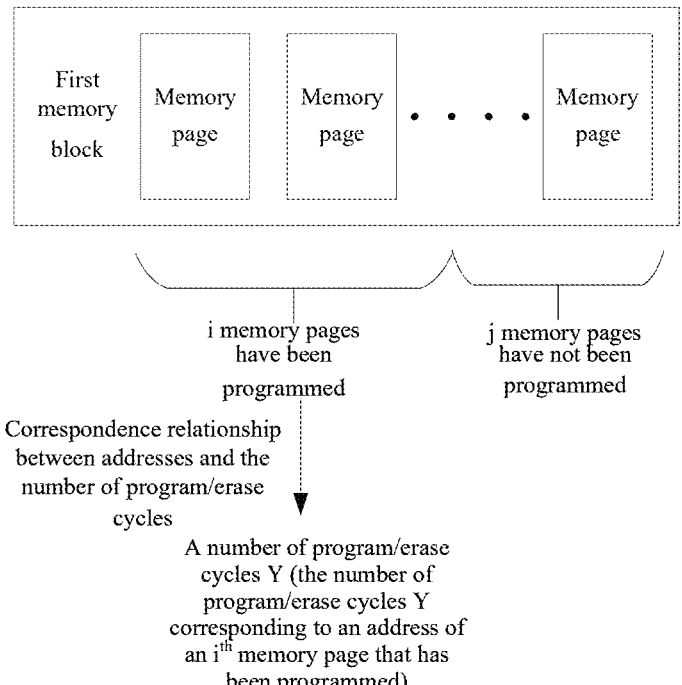
FIG. 10 is a schematic diagram of a method of determining a number of program/erase cycles provided by examples of the present application.

FIG. 10 is a schematic diagram of a method of determining a number of program/erase cycles provided by examples of the present application. As shown in FIG. 10, the control logic circuit may perform the read operation on the first memory block to determine that there are i memory pages in the first memory block that have been programmed. In one example, the control logic circuit may determine, according to the number of program/erase cycles indicated by each programmed memory page, the number of program/erase cycles of the second memory block. If the number of program/erase cycles indicated by one programmed memory page is 3, it may be determined that the current number of program/erase cycles of the second memory block is 3i. In another example, the control logic circuit may determine an address of an $i^{th}$ programmed memory page of the i memory pages that have been programmed, and acquire, from the correspondence relationship between addresses of the memory pages and the number of program/erase cycles, Y corresponding to the address of the $i^{th}$ programmed memory page, i.e., the current number of program/erase cycles of the second memory block is Y.

In order to further accelerate acquisition of the number of times the second memory block in the memory is read, in the examples of the present application, the number of program/erase cycles of each of the second memory blocks may also be stored in the register in the peripheral circuit, wherein the register storing the number of program/erase cycles of the second memory block may be referred to as a first register.

In one example, each time after the memory device is powered on, the control logic circuit may perform the read operation on the first memory block to acquire the number of program/erase cycles of the second memory block that is recorded in the memory device in a previous power cycle. After the number of program/erase cycles is acquired, the number of program/erase cycles may be stored in the first register. Each time when the control logic circuit subsequently performs program processing on the memory page included in the first memory block, the number of program/erase cycles stored in the first register may be increment by 1, such that it may ensure that the number of program/erase cycles stored in the first register is synchronized with the number of program/erase cycles indicated by the memory page in the first memory block that has been programmed.

In another example, each time after the memory device is powered on and receives an erase instruction for the first time, the control logic circuit may perform the read operation on the first memory block to acquire the number of program/erase cycles of the second memory block in the memory device in the previous power cycle. Respective processing is as follows:

after the memory device is powered on, a first identification value is written to a second register in the plurality of registers, wherein the first identification value is to indicate that the memory does not receive an erase instruction after being powered on. After receiving an erase instruction, in response to the first identification value stored in the second register, the memory pages in the first memory block that have been subjected to program processing are determined, and the number of program/erase cycles corresponding to the second memory block is determined according to the memory pages that have been subjected to program processing.

In some implementations, the control logic circuit may set an identification value in the register to determine whether the memory device receives an erase instruction after being powered on, wherein the register storing the identification value may be referred to as the second register. For example, after the memory device is powered on, the control logic circuit may store the first identification value in the second register, for example, the first identification value is "1". Each time after the control logic circuit receives an erase instruction, whether the identification value stored in the second register is the first identification value may be determined; and if it is determined that the identification value stored in the second register is the first identification value, an erase instruction currently received may be determined as the first one of the erase instructions received after the memory device is powered on, such that the read operation may be performed on the first memory block to acquire the number of program/erase cycles of the second memory block in the current memory device.

Correspondingly, after receiving an erase instruction and determining that the identification value stored in the second register is the first identification value, the control logic circuit may update the first identification value stored in the second register to a second identification value, for example, the first identification value is "0". The second identification value may be to indicate that the memory device has received an erase instruction after being powered on.

Figure 11:
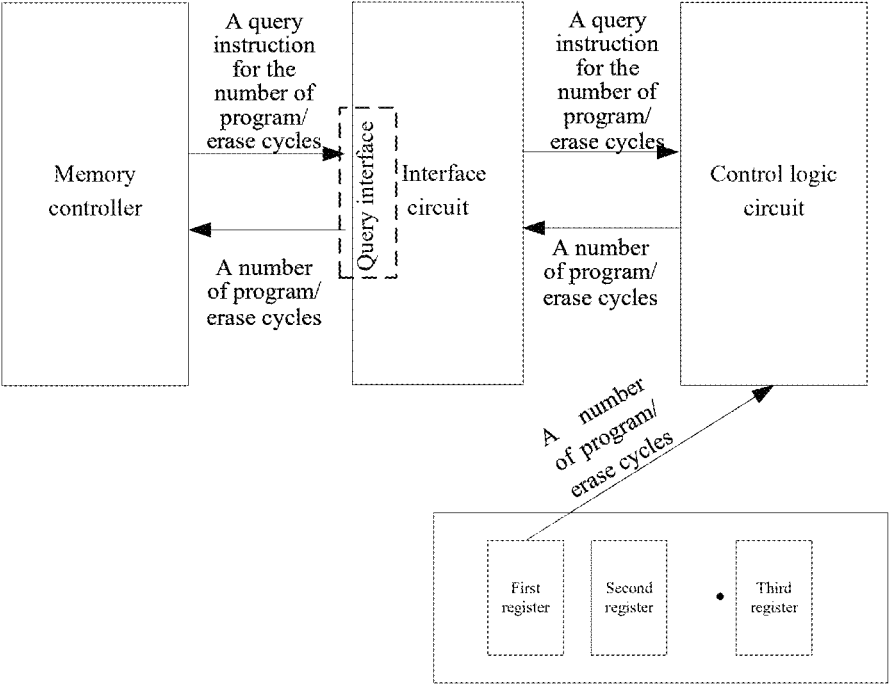
FIG. 11 is a flow diagram of a query method of a number of program/erase cycles of a memory block provided by examples of the present application.

FIG. 11 is a flow diagram of a query method of a number of program/erase cycles of a memory block provided by examples of the present application. In one example, an interface circuit included in a peripheral circuit may be configured with a query interface. In some implementations, a memory controller may send an query instruction for the number of program/erase cycles to a control logic circuit through the query interface. After receiving the query instruction for the number of program/erase cycles, the control logic circuit may read the stored number of program/erase cycles from a first register, and return the stored number of program/erase cycles to the memory controller. It can be seen that, in the examples of the present application, the number of program/erase cycles may also be synchronously recorded in the first register, such that the efficiency of the memory controller to acquire the number of program/erase cycles can be improved.

Figure 12:
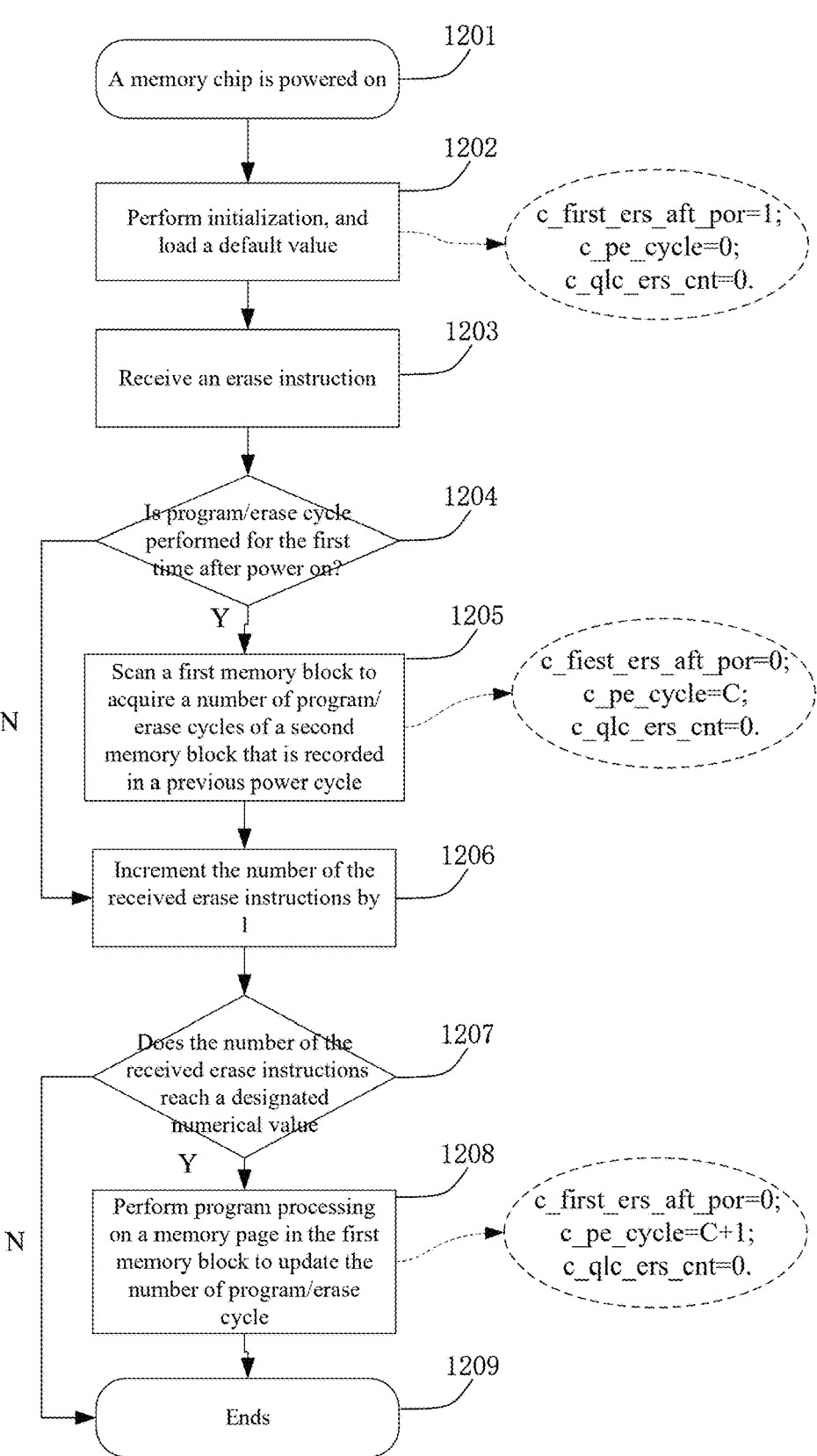
FIG. 12 is a flow diagram of a method of recording a number of program/erase cycles provided by examples of the present application.

FIG. 12 is a flow diagram of a method of recording a number of times provided by examples of the present application. The method may be performed by a control logic circuit. Referring to FIG. 12, the method comprises:

operation 1201, a memory chip being powered on;

operation 1202, performing initialization, and loading a default value, wherein the default value comprises a number of received erase instructions c_qle_ers_cnt, a number of program/erase cycles c_pe_cycle of a second memory block, and an identification value c_fiest_ers_aft_por for indicating whether the memory chip receives an erase instruction after being powered on; in an example, the default values of the c_qlc_ers_cnt and the c_pe_cycle may be 0; the default value of the c_fiest_ers_aft_por may be set to 1 to indicate that the memory chip does not receive an erase instruction after being powered on; and the c_qlc_ers_cnt, the c_pe_cycle, and the c_fiest_ers_aft_por may be respectively stored different registers;

operation 1203, receiving an erase instruction, wherein after receiving the erase instruction, the control logic circuit may perform program/erase cycles on respective memory blocks according to addresses of the memory blocks that are carried in the erase instruction;

operation 1204, determining whether an program/erase cycle is performed for the first time after power on, wherein after receiving the erase instruction, the control logic circuit may determine whether an program/erase cycle currently performed is an program/erase cycle performed for the first time after the memory chip is powered on; in some implementations, the control logic circuit may determine whether a value of the c_fiest_ers_aft_por stored in the register is 1, if the value is 1, it may be determined that the program/erase cycle currently performed is an program/erase cycle performed for the first time after the chip device is powered on, and the value may be changed to 0, and then operation 1205 is performed; and if the value is 0, it is determined that the program/erase cycle currently performed is not an program/erase cycle performed for the first time after the chip device is powered on, and then operation 1206 is performed;

operation 1205: scanning a first memory block to acquire the number of program/erase cycles of the second memory block that is recorded in a previous power cycle, wherein after receiving the erase instruction for the first time after being powered on, the control logic circuit may scan the first memory block to acquire a number of memory pages in the first memory block that have been subjected to program processing, so as to obtain the number of program/erase cycles C of the second memory block that is recorded in a previous power cycle; and after the number of program/erase cycles C is obtained, a value of the c_pe_cycle in the register may be changed to the number of program/erase cycles C;

operation 1206, incrementing the number of the received erase instructions by 1, wherein each time after receiving the erase instruction, the control logic circuit may increment the c_qlc_ers_cnt stored in the register by 1;

operation 1207, determining whether the number of the received erase instructions reaches a designated numerical value, wherein after incrementing the c_qlc_ers_cn stored in the register by 1, the control logic circuit may determine whether the value of the c_qlc_ers_en reaches the set designated numerical value, and the designated numerical value is the number threshold mentioned in the above-mentioned examples; if the value of the c_qle_ers_en reaches the set designated numerical value, operation 1208 may be performed; and if the value of the c_ql-c_ers_cn does not reach the set designated numerical value, operation 1209 may be performed, i.e., the maintaining of the number of program/erase cycles is ended after the erase instruction is received currently;

operation 1208, performing program processing on a memory page in the first memory block to update the number of program/erase cycles, wherein the determined value of the c_qlc_ers_cn reaches the set designated numerical value, and it indicates that a preset number of program/erase cycles are performed on each of the second memory blocks in the memory chip, such that the control logic circuit may select, according to an address sequence of the memory page, one memory page in the first memory block that is not subjected to program processing, and perform program processing on the selected memory page, so as to cause the number of the memory pages in the first memory block that are subjected to program processing to indicate the number of program/erase cycles of each of the second memory blocks in the memory chip; and the control logic circuit may also increment the value of the c_pe_cycle stored in the register by 1, so as to ensure that the number of program/erase cycles indicated by the memory page in the first memory block that has been programmed is synchronized with the number of program/erase cycles stored in the register; and operation 1209, ending.

In the examples of the present application, the control logic circuit may determine, through the number of the memory pages in the first memory block that have been programmed, the number of program/erase cycles of the second memory block, and synchronously record the number of program/erase cycles through the register. Therefore, the memory chip does not require to be configured with power failure protection for the number of program/erase cycles recorded in the register, and after the memory chip is powered down, memory states of the memory pages in the first memory block that have been programmed do not change, such that the number of program/erase cycles recorded by the memory pages in the first memory block that have been programmed is not lost. After the memory chip is powered on, the number of program/erase cycles may be determined according to the memory pages in the first memory block that have been programmed, and then written to the register. It can be seen that, in the examples of the present application, the memory controller can be prevented from respectively recording the number of program/erase cycles for the plurality of memory devices, thereby reducing a processing pressure of the memory controller. Furthermore, power failure losses of the number of program/erase cycles can also be avoided, such that the stability of recording the number of program/erase cycles can be improved.

All the above-mentioned example technical solutions may be employed in any combination to form the example implementation of the present application, and are not described in detail herein again.

Examples of the present application provide a memory device. The memory device may be any one of memory devices in the above-mentioned examples. The memory device comprises a memory cell array and a peripheral circuit.

The memory cell array comprises a plurality of memory blocks, and each memory block comprises a plurality of memory pages.

The peripheral circuit is coupled to the memory cell array and configured to: receive an erase instruction, and record a number of the received erase instructions, wherein the erase instruction is to instruct the peripheral circuit to erase one memory block in a memory cell array; and in response to the number of the received erase instructions reaching a number threshold, select one memory page in a first memory block of the memory cell array to perform program processing, wherein the number threshold is equal to the number of received erase instructions required for performing a preset number of program/erase cycles on each of second memory blocks in the memory cell array other than the first memory block, and a number of the memory pages in the first memory block that have been subjected to program processing is to indicate the number of program/erase cycles of the second memory block.

In an example, the preset number of times is equal to a ratio of a rated number of program/erase cycles corresponding to the second memory block to the number of memory pages in the first memory block.

In an example, the peripheral circuit comprises a plurality of registers and is further configured to:

determine the memory pages in the first memory block that have been subjected to program processing, and determine the number of program/erase cycles corresponding to the second memory block according to the memory pages that have been subjected to program processing; and write the determined number of program/erase cycles to a first register in the plurality of registers.

In an example, the peripheral circuit further comprises an interface circuit and is further configured to:

receive, by a query interface provided in the interface circuit, an query instruction for the number of program/erase cycles sent by a memory controller coupled with the memory device, and return the number of program/erase cycles stored in the first register to the memory controller.

In an example, the peripheral circuit is configured to: determine a target address corresponding to the last memory page that has been subjected to program processing most recently among the memory pages that have been subjected to program processing; and determine the number of program/erase cycles corresponding to the target address according to a correspondence relationship between addresses and the number of program/erase cycles.

In an example, the peripheral circuit is configured to: after the memory device is powered on, determine the memory pages in the first memory block that have been subjected to program processing, and determine the number of program/erase cycles corresponding to the second memory block according to the memory pages that have been subjected to program processing.

In an example, the peripheral circuit is configured to: after the memory device is powered on, write a first identification value to a second register in the plurality of registers, wherein the first identification value is to indicate that the memory device does not receive an erase instruction after being powered on; and after receiving an erase instruction, in response to the first identification value stored in the second register, determine the memory pages in the first memory block that have been subjected to program processing, and determine the number of program/erase cycles corresponding to the second memory block according to the memory pages that have been subjected to program processing.

In an example, the peripheral circuit is further configured to: after receiving an erase instruction, in response to the first identification value stored in the second register, update the first identification value stored in the second register to a second identification value.

In an example, the peripheral circuit is further configured to: in response to the number of the received erase instructions reaching the number threshold, increment the number of program/erase cycles stored in the first register by 1.

In an example, the peripheral circuit is further configured to: in response to the number of the received erase instructions reaching the number threshold, reset the recorded number of the received erase instructions to 0.

The descriptions with respect to the memory device examples are similar to the descriptions of the above method examples, and have beneficial effects similar to the method examples. Technical details that are not disclosed in the memory device examples of the present application are determined with reference to the descriptions of the method examples of the present application.

Examples of the present application further provide a memory system. The memory system may be the memory system in FIG. 1. The memory system may comprise the memory device provided by the present application, and a memory controller coupled to the memory device and configured to control the memory device.

The descriptions with respect to the memory system examples are similar to the descriptions of the above method examples, and have beneficial effects similar to the method examples. Technical details that are not disclosed in the memory system examples of the present application are determined with reference to the descriptions of the method examples of the present application.

In the present application, the terms "first" and "second" are for descriptive purposes only, and are not construed as indicating or implying relative importance. The term "at least one" means one or more, and the term "a plurality of" means two or more, unless otherwise defined clearly.

Examples of the present application provide a memory device, a control method of a memory device, and a memory system, which may reduce the pressure of a memory controller to maintain the number of program/erase cycles, and respective technical solutions are as follows:

a first aspect provides a control method of a memory device, wherein the memory device comprises a peripheral circuit and a memory cell array, and the control method comprises:

the peripheral circuit receiving an erase instruction, and recording a number of the received erase instructions, wherein the erase instruction is to instruct the peripheral circuit to erase one memory block in a memory cell array; and the peripheral circuit, in response to the recorded number of the erase instructions reaching a number threshold, selecting one memory page in a first memory block of the memory cell array to perform program processing, wherein the number threshold is equal to a total number of received erase instructions required for performing a preset number of program/erase cycles on each of second memory blocks in the memory cell array other than the first memory block, and a number of the memory pages in the first memory block that have been subjected to program processing is to indicate the number of program/erase cycles of the second memory block.

In an example, the preset number of times is equal to a ratio of a rated number of program/erase cycles corresponding to the second memory block to the number of memory pages in the first memory block.

In an example, the peripheral circuit comprises a plurality of registers, and the control method further comprises: determining the memory pages in the first memory block that have been subjected to program processing, and determining the number of program/erase cycles corresponding to the second memory block according to the memory pages that have been subjected to program processing; and writing the determined number of program/erase cycles to a first register in the plurality of registers.

In an example, the peripheral circuit further comprises an interface circuit, and the control method further comprises: receiving, by a query interface provided in the interface circuit, an query instruction for the number of program/erase cycles sent by a memory controller coupled with the memory device, and returning the number of program/erase cycles stored in the first register to the memory controller.

In an example, the above-mentioned processing of determining the memory pages in the first memory block that have been subjected to program processing, and determining the number of program/erase cycles corresponding to the second memory block according to the memory pages that have been subjected to program processing comprises: determining a target address corresponding to the last memory page that has been subjected to program processing most recently among the memory pages that have been subjected to program processing; and determining the number of program/erase cycles corresponding to the target address according to a correspondence relationship between addresses and the number of program/erase cycles.

In an example, the determining the memory pages in the first memory block that have been subjected to program processing, and determining the number of program/erase cycles corresponding to the second memory block according to the memory pages that have been subjected to program processing comprises: after the memory device is powered on, determining the memory pages in the first memory block that have been subjected to program processing, and determining the number of program/erase cycles corresponding to the second memory block according to the memory pages that have been subjected to program processing.

In an example, after the memory device is powered on, determining the memory pages in the first memory block that have been subjected to program processing, and determining the number of program/erase cycles corresponding to the second memory block according to the memory pages that have been subjected to program processing comprises: after the memory device is powered on, writing a first identification value to a second register in the plurality of registers, wherein the first identification value is to indicate that the memory device does not receive an erase instruction after being powered on; and after receiving an erase instruction, in response to the first identification value stored in the second register, determining the memory pages in the first memory block that have been subjected to program processing, and determining the number of program/erase cycles corresponding to each of the second memory blocks according to the memory pages that have been subjected to program processing.

In an example, the control method further comprises: after receiving an erase instruction, in response to the first identification value stored in the second register, updating the first identification value stored in the second register to a second identification value.

In an example, the control method further comprises: in response to the number of the received erase instructions reaching the number threshold, incrementing the number of program/erase cycles stored in the first register by 1.

In an example, the control method further comprises: in response to the number of the received erase instructions reaching the number threshold, resetting the recorded number of the received erase instructions to 0.

A second aspect provides a memory device, comprising a memory cell array and a peripheral circuit.

The memory cell array comprises a plurality of memory blocks, and each memory block comprises a plurality of memory pages.

The peripheral circuit is coupled to the memory cell array and configured to: receive an erase instruction, and record a number of the received erase instructions, wherein the erase instruction is to instruct the peripheral circuit to erase one memory block in a memory cell array; and in response to the number of the received erase instructions reaching a number threshold, select one memory page in a first memory block of the memory cell array to perform program processing, wherein the number threshold is equal to the number of received erase instructions required for performing a preset number of program/erase cycles on each of second memory blocks in the memory cell array other than the first memory block, and a number of the memory pages in the first memory block that have been subjected to program processing is to indicate the number of program/erase cycles of the second memory block.

In an example, the preset number of times is equal to a ratio of a rated number of program/erase cycles corresponding to the second memory block to the number of memory pages in the first memory block.

In an example, the peripheral circuit comprises a plurality of registers and is further configured to:
 determine the memory pages in the first memory block that have been subjected to program processing, and determine the number of program/erase cycles corresponding to the second memory block according to the memory pages that have been subjected to program processing; and write the determined number of program/erase cycles to a first register in the plurality of registers.

In an example, the peripheral circuit further comprises an interface circuit and is further configured to:
 receive, by a query interface provided in the interface circuit, an query instruction for the number of program/erase cycles sent by a memory controller coupled with the memory device, and return the number of program/erase cycles stored in the first register to the memory controller.

In an example, the peripheral circuit is configured to: determine a target address corresponding to the last memory page that has been subjected to program processing most recently among the memory pages that have been subjected to program processing; and determine the number of program/erase cycles corresponding to the target address according to a correspondence relationship between addresses and the number of program/erase cycles.

In an example, the peripheral circuit is configured to: after the memory device is powered on, determine the memory pages in the first memory block that have been subjected to program processing, and determine the number of program/erase cycles corresponding to the second memory block according to the memory pages that have been subjected to program processing.

In an example, the peripheral circuit is configured to: after the memory device is powered on, write a first identification value to a second register in the plurality of registers, wherein the first identification value is to indicate that the memory device does not receive an erase instruction after being powered on; and after receiving an erase instruction, in response to the first identification value stored in the second register, determine the memory pages in the first memory block that have been subjected to program processing, and determine the number of program/erase cycles corresponding to the second memory block according to the memory pages that have been subjected to program processing.

In an example, the peripheral circuit is further configured to: after receiving an erase instruction, in response to the first identification value stored in the second register, update the first identification value stored in the second register to a second identification value.

In an example, the peripheral circuit is further configured to: in response to the number of the received erase instructions reaching the number threshold, increment the number of program/erase cycles stored in the first register by 1.

In an example, the peripheral circuit is further configured to: in response to the number of the received erase instructions reaching the number threshold, reset the recorded number of the received erase instructions to 0.

A third aspect provides a memory system, comprising one or more memory devices as described in the second aspect and/or examples included in the second aspect, and a memory controller coupled to the one or more memory devices and configured to control the one or more memory devices.

The technical solutions provided by the examples of the present application comprise the following beneficial effects:

in the examples of the present application, the memory device may indicate, according to the number of memory pages in the first memory block that are subjected to program processing, the number of program/erase cycles of other second memory blocks. In this way, in one aspect, the memory records the number of program/erase cycles of its own memory blocks, such that the memory controller can be prevented from respectively recording the number of program/erase cycles for the plurality of coupled memory devices, thereby reducing a processing pressure of the memory controller. In another aspect, power failure losses of the number of program/erase cycles can be avoided by indicating the number of program/erase cycles according to the number of memory pages that have been subjected to program processing, such that the stability of recording the number of program/erase cycles can be improved.

The above are only examples of the present application, and are not used to limit the present application. Any modifications, equivalent replacements and improvements and the like made within the spirit and principle of the present application shall be included within the scope of protection of the present application.

What is claimed is:

1. A method of operating a memory device, wherein the memory device includes a peripheral circuit and a memory cell array, and the method comprises, by the peripheral circuit:

receiving an erase instruction, and recording a number of received erase instructions, wherein the erase instruction is to instruct the peripheral circuit to erase one memory block in the memory cell array; and in response to the number of the received erase instructions reaching a number threshold, selecting one memory page in a first memory block of the memory cell array to perform program processing, wherein the number threshold is equal to a total number of received erase instructions required for performing a preset number of program/erase cycles on each of second memory blocks in the memory cell array other than the first memory block, a number of memory pages in the first memory block that have been subjected to program processing is to indicate a number of program/erase cycles of the second memory blocks, and the preset number of program/erase cycles is equal to a ratio of a rated number of program/erase cycles corresponding to the second memory blocks to the number of memory pages in the first memory block.

2. The method of claim 1, wherein the peripheral circuit includes a plurality of registers, and the method further includes:

determining the number of memory pages in the first memory block that have been subjected to program processing, and determining the number of program/erase cycles corresponding to the second memory blocks according to the number of memory pages that have been subjected to program processing; and writing the determined number of program/erase cycles to a first register in the plurality of registers.

3. The method of claim 2, wherein the peripheral circuit further includes an interface circuit, and the method further includes:

receiving, by a query interface configured in the interface circuit, a query instruction for the number of program/erase cycles sent by a memory controller coupled with the memory device, and returning the number of program/erase cycles stored in the first register to the memory controller.

4. The method of claim 2, wherein determining the number of memory pages in the first memory block that have been subjected to program processing, and determining the number of program/erase cycles corresponding to the second memory blocks according to the number of memory pages that have been subjected to program processing includes:

determining a target address corresponding to a memory page that has been subjected to program processing most recently among the number of memory pages that have been subjected to program processing; and determining the number of program/erase cycles corresponding to the target address according to a correspondence relationship between addresses and the number of program/erase cycles.

5. The method of claim 2, wherein determining the number of memory pages in the first memory block that have been subjected to program processing, and determining the number of program/erase cycles corresponding to the second memory blocks according to the number of memory pages that have been subjected to program processing includes:

after the memory device is powered on, determining the number of memory pages in the first memory block that have been subjected to program processing, and determining the number of program/erase cycles corresponding to the second memory blocks according to the number of memory pages that have been subjected to program processing.

6. The method of claim 5, wherein after the memory device is powered on, determining the number of memory pages in the first memory block that have been subjected to program processing, and determining the number of program/erase cycles corresponding to the second memory blocks according to the number of memory pages that have been subjected to program processing includes:

after the memory device is powered on, writing a first identification value to a second register in the plurality of registers, wherein the first identification value is to indicate that the memory device does not receive the erase instruction after being powered on; and after receiving the erase instruction, in response to the first identification value stored in the second register, determining the number of memory pages in the first memory block that have been subjected to program processing, and determining the number of program/erase cycles corresponding to the second memory blocks according to the number of memory pages that have been subjected to program processing.

7. The method of claim 6, further including:

after receiving the erase instruction, in response to the first identification value stored in the second register, updating the first identification value stored in the second register to a second identification value.

8. The method of claim 2, further including:

in response to the number of the received erase instructions reaching the number threshold, incrementing the number of program/erase cycles stored in the first register by 1.

9. The method of claim 1, further including:

in response to the number of the received erase instructions reaching the number threshold, resetting the recorded number of the received erase instructions to 0.

10. A memory device, comprising:

a memory cell array including a plurality of memory blocks, wherein each memory block includes a plurality of memory pages; and a peripheral circuit coupled to the memory cell array and configured to:

receive an erase instruction, and record a number of received erase instructions, wherein the erase instruction is to instruct the peripheral circuit to erase one memory block in the memory cell array; and in response to the number of the received erase instructions reaching a number threshold, select one memory page in a first memory block of the memory cell array to perform program processing, wherein the number threshold is equal to a total number of received erase instructions required for performing a preset number of program/erase cycles on each of second memory blocks in the memory cell array other than the first memory block, a number of memory pages in the first memory block that have been subjected to program processing is to indicate a number of program/erase cycles of the second memory blocks, and the preset number of program/ erase cycles is equal to a ratio of a rated number of program/erase cycles corresponding to the second memory blocks to the number of memory pages in the first memory block.

11. The memory device of claim 10, wherein the peripheral circuit includes a plurality of registers and is further configured to:

determine the number of memory pages in the first memory block that have been subjected to program processing, and determine the number of program/erase cycles corresponding to the second memory blocks according to the number of memory pages that have been subjected to program processing; and write the determined number of program/erase cycles to a first register in the plurality of registers.

12. The memory device of claim 11, wherein the peripheral circuit further includes an interface circuit and is further configured to:

receive, by a query interface configured in the interface circuit, a query instruction for the number of program/ erase cycles sent by a memory controller coupled with the memory device, and return the number of program/ erase cycles stored in the first register to the memory controller.

13. The memory device of claim 11, wherein the peripheral circuit is configured to:

determine a target address corresponding to a memory page that has been subjected to program processing most recently among the number of memory pages that have been subjected to program processing; and determine the number of program/erase cycles corresponding to the target address according to a correspondence relationship between addresses and the number of program/erase cycles.

14. The memory device of claim 11, wherein the peripheral circuit is configured to:

after the memory device is powered on, determine the number of memory pages in the first memory block that have been subjected to program processing, and determine the number of program/erase cycles corresponding to the second memory blocks according to the number of memory pages that have been subjected to program processing.

15. The memory device of claim 14, wherein the peripheral circuit is configured to:

after the memory device is powered on, write a first identification value to a second register in the plurality of registers, wherein the first identification value is to indicate that the memory device does not receive the erase instruction after being powered on; and after receiving the erase instruction, in response to the first identification value stored in the second register, determine the number of memory pages in the first memory block that have been subjected to program processing, and determine the number of program/erase cycles corresponding to the second memory blocks according to the number of memory pages that have been subjected to program processing.

16. The memory device of claim 15, wherein the peripheral circuit is further configured to:

after receiving the erase instruction, in response to the first identification value stored in the second register, update the first identification value stored in the second register to a second identification value.

17. The memory device of claim 11, wherein the peripheral circuit is further configured to:

in response to the number of the received erase instructions reaching the number threshold, increment the number of program/erase cycles stored in the first register by 1.

18. A memory system, comprising:

one or more memory devices each including:

a memory cell array including a plurality of memory blocks, wherein each memory block includes a plurality of memory pages; and a peripheral circuit coupled to the memory cell array and configured to:

receive an erase instruction, and record a number of received erase instructions, wherein the erase instruction is to instruct the peripheral circuit to erase one memory block in the memory cell array; and in response to the number of the received erase instructions reaching a number threshold, select one memory page in a first memory block of the memory cell array to perform program processing, wherein the number threshold is equal to a total number of received erase instructions required for performing a preset number of program/erase cycles on each of second memory blocks in the memory cell array other than the first memory block, a number of memory pages in the first memory block that have been subjected to program processing is to indicate a number of program/erase cycles of the second memory blocks, and the preset number of program/ erase cycles is equal to a ratio of a rated number of program/erase cycles corresponding to the second memory blocks to the number of memory pages in the first memory block; and a memory controller coupled to the one or more memory devices and configured to control the one or more memory devices.

19. The memory system of claim 18, wherein the peripheral circuit includes a plurality of registers, and the peripheral circuit is configured to:

determine the number of memory pages in the first memory block that have been subjected to program processing, and determining the number of program/ erase cycles corresponding to the second memory blocks according to the number of memory pages that have been subjected to program processing; and write the determined number of program/erase cycles to a first register in the plurality of registers.

20. The memory system of claim 19, wherein the peripheral circuit further includes an interface circuit, and the peripheral circuit is configured to:

receive, by a query interface configured in the interface circuit, a query instruction for the number of program/erase cycles sent by the memory controller, and return the number of program/erase cycles stored in the first register to the memory controller.

* * * * *